(12) United States Patent
Kim et al.

(10) Patent No.: US 8,440,489 B2
(45) Date of Patent: May 14, 2013

(54) METHOD OF MANUFACTURING SOLAR CELL

(75) Inventors: Dong-Kyun Kim, Suwon-si (KR); Yun-Gi Kim, Yongin-si (KR); Jin-Wook Lee, Suwon-si (KR); Hwa-Young Ko, Seoul (KR)

(73) Assignee: Samsung Electronics Co., Ltd. (KR)

( * ) Notice: Subject to any disclaimer, the term of this patent is extended or adjusted under 35 U.S.C. 154(b) by 214 days.

(21) Appl. No.: 12/828,701

(22) Filed: Jul. 1, 2010

(65) Prior Publication Data

US 2011/0183459 A1 Jul. 28, 2011

(30) Foreign Application Priority Data

Jan. 25, 2010 (KR) .................. 10-2010-0006677

(51) Int. Cl.
*H01L 21/00* (2006.01)
(52) U.S. Cl.
USPC ............... 438/57; 257/E27.126; 257/462
(58) Field of Classification Search ............ 438/57; 257/462, E27.126
See application file for complete search history.

(56) References Cited

U.S. PATENT DOCUMENTS

| 2002/0058382 A1* | 5/2002 | Shelton et al. ............ 438/275 |
| 2007/0169808 A1* | 7/2007 | Kherani et al. ............ 136/258 |
| 2008/0078444 A1* | 4/2008 | Atanackovic ............ 136/256 |

FOREIGN PATENT DOCUMENTS

| JP | 07131040 | 5/1995 |
| JP | 09246582 | 9/1997 |
| JP | 2001015780 | 1/2001 |
| JP | 2001203373 | 7/2001 |
| JP | 2006156646 | 6/2006 |

* cited by examiner

*Primary Examiner* — Jarrett Stark
(74) *Attorney, Agent, or Firm* — Cantor Colburn LLP (57) ABSTRACT

A method of manufacturing a solar cell includes providing a semiconductor substrate; disposing a reflection layer on one side of the semiconductor substrate, wherein the disposing the reflection layer comprises implanting gas into a surface of the one side of the semiconductor substrate and heating the gas; disposing an n+ region and a p+ region separated from each other on the other opposite facing side of the semiconductor substrate; disposing a first electrode connected to the n+ region; and disposing a second electrode connected to the p+ region.

15 Claims, 9 Drawing Sheets

METHOD OF MANUFACTURING SOLAR CELL

CROSS-REFERENCE TO RELATED APPLICATION

This application claims priority to Korean Patent Application No. 10-2010-0006677, filed on Jan. 25, 2010, and all the benefits accruing therefrom under 35 U.S.C. §119, the content of which in its entirety is herein incorporated by reference.

BACKGROUND

1) Field

This disclosure generally relates to a method for manufacturing a solar cell.

2) Description of the Related Art

A solar cell is a photoelectric conversion device that transforms photonic energy, e.g., solar energy, into electrical energy, and has been recognized as a renewable and pollution-free next generation energy source.

A solar cell typically includes p-type and n-type semiconductors and produces electrical energy by transferring electrons and holes to the n-type and p-type semiconductors, respectively, and then collecting electrons and holes in electrodes when an electron-hole pair ("EHP") is produced by photonic energy absorbed in a photoactive layer inside the semiconductors.

Further, it is desirable for a solar cell to be as efficient as possible for producing electrical energy from photonic energy, e.g., solar energy. In order to increase the efficiency of a solar cell, it is important to increase a light absorption rate thereof. While short-wavelength light is easily absorbed by a semiconductor substrate (e.g., silicon crystal), long-wavelength light is rarely absorbed but is instead transmitted through the crystal in the semiconductor substrate, e.g., silicon crystal. Furthermore, long-wavelength light is more easily transmitted if the substrate of the solar cell is thinner, that is to say that an increase of transmission of long-wavelength light through the semiconductor substrate is inversely proportional to an increase in the thickness thereof.

SUMMARY

One aspect of this disclosure includes a method of manufacturing a solar cell having improved efficiency by enhancing a long-wavelength light absorption rate.

According to one aspect, a method of manufacturing a solar cell includes: providing a semiconductor substrate; disposing a reflection layer on one side of the semiconductor substrate, wherein the disposing a reflection layer comprises implanting gas into a surface of the one side of the semiconductor substrate and heating the gas; disposing an n+ region and a p+ region separated from each other on the other opposite facing side of the semiconductor substrate; disposing a first electrode connected to the n+ region; and disposing a second electrode connected to the p+ region.

The reflection layer may be disposed on the other opposite facing side of the semiconductor substrate where the first electrode and the second electrode are disposed.

The gas implanted into the surface of the semiconductor substrate may include $N_2$, $O_2$, or a combination thereof, for example.

Implanting gas into the surface of the semiconductor substrate may include using a dose of gas ranging from about $1 \times 10^{10}$ per square centimeter ($/cm^2$) to about $1 \times 10^{19}/cm^2$ and using energy of about 10 kilo electron volt (keV) to about 200 keV.

The heating may be performed at a temperature of about 600° Celsius (C.) to about 1500° C.

The method may further include disposing an anti-reflection layer on the surface of the other opposite facing side of the semiconductor substrate.

The method may further include disposing a passivation layer on one surface of the reflection layer.

Further, other aspects of this disclosure will be described in the following detailed description.

BRIEF DESCRIPTION OF THE DRAWINGS

The above and other aspects, advantages and features of this disclosure will become more apparent by describing in further detail embodiments thereof with reference to the accompanying drawings, in which.

DETAILED DESCRIPTION

The general inventive concept now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present invention will be described in further detail with reference to the accompanying drawings.

Figure 1:
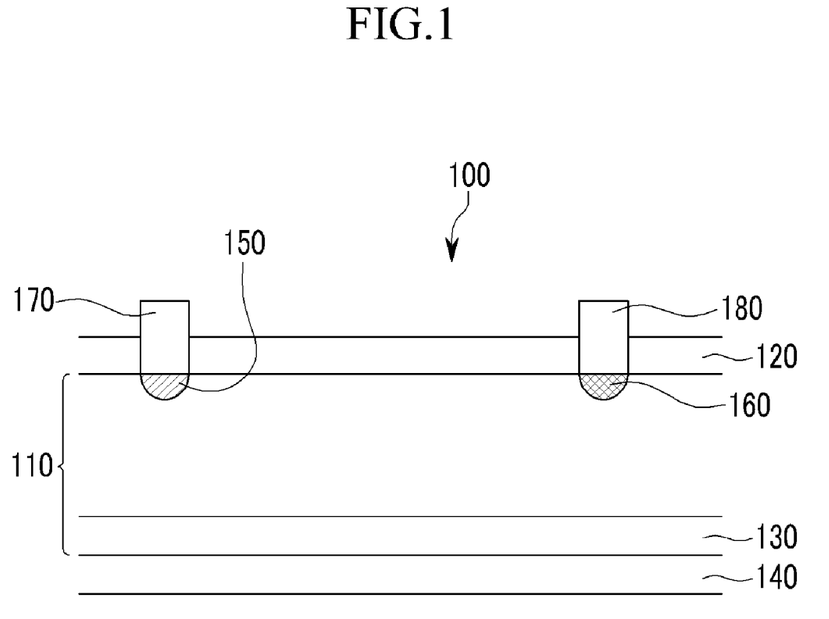
FIG. 1 is a cross-sectional view of an embodiment of a solar cell.

Referring to FIG. 1, an embodiment of a solar cell is shown.

Figure 2A:
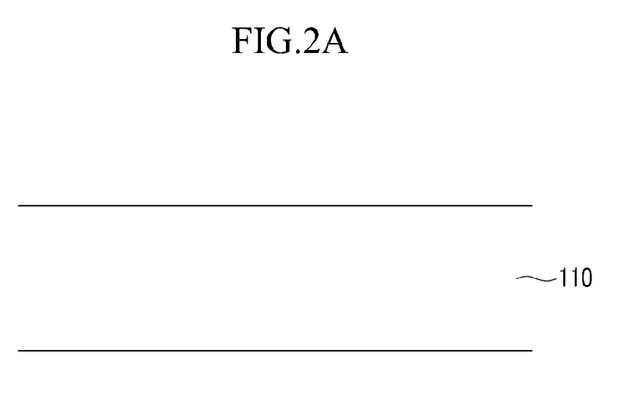
FIGS. 2A to 2O are cross-sectional views showing an embodiment of a method of manufacturing the embodiment of a solar cell.
Figure 2B:
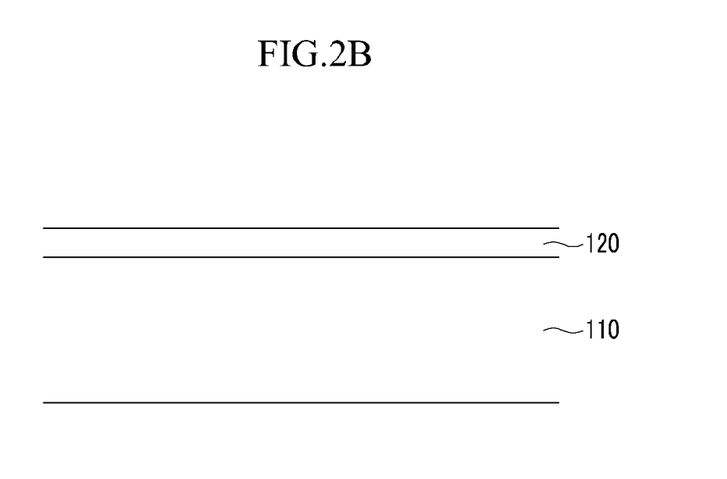
Figure 2C:
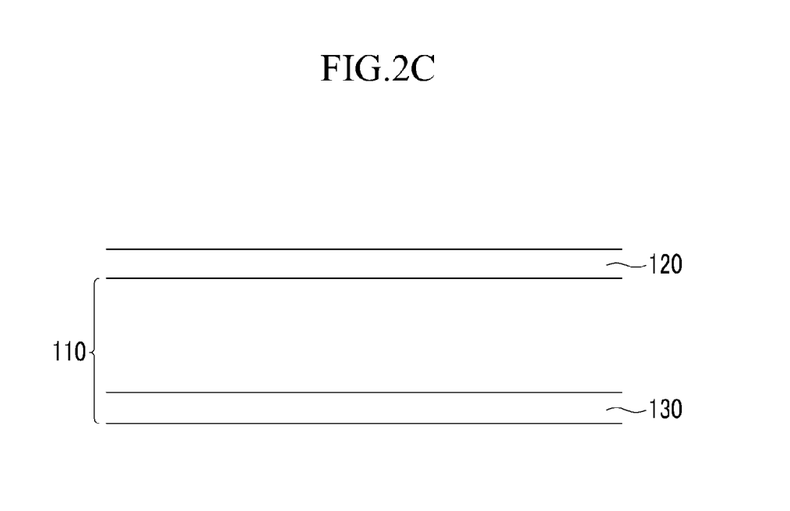
Figure 2D:
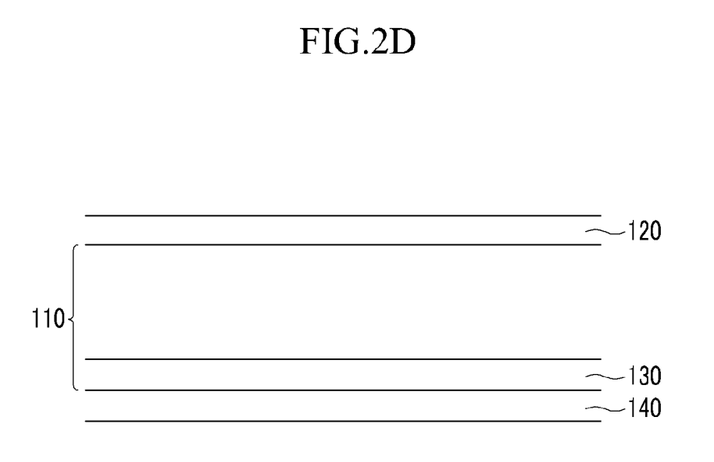
Figure 2E:
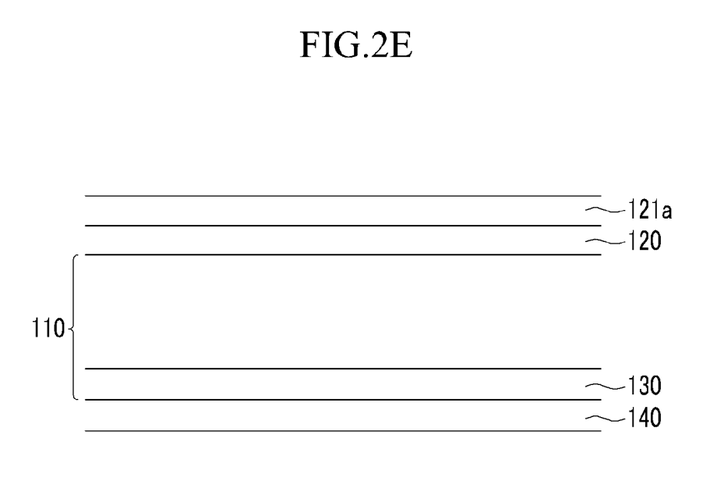
Figure 2F:
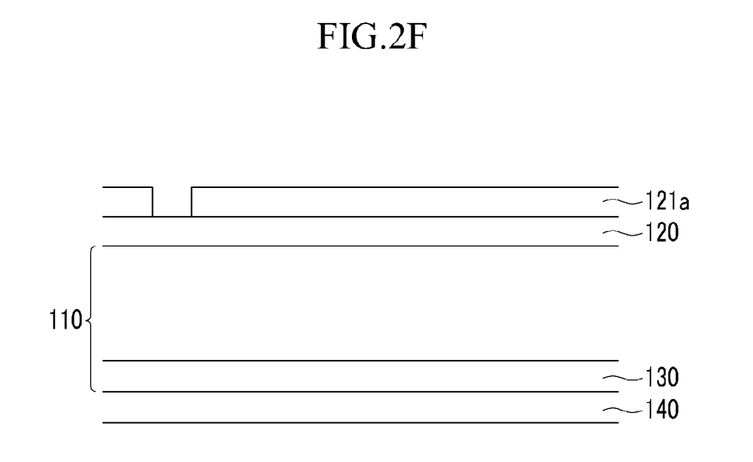
Figure 2G:
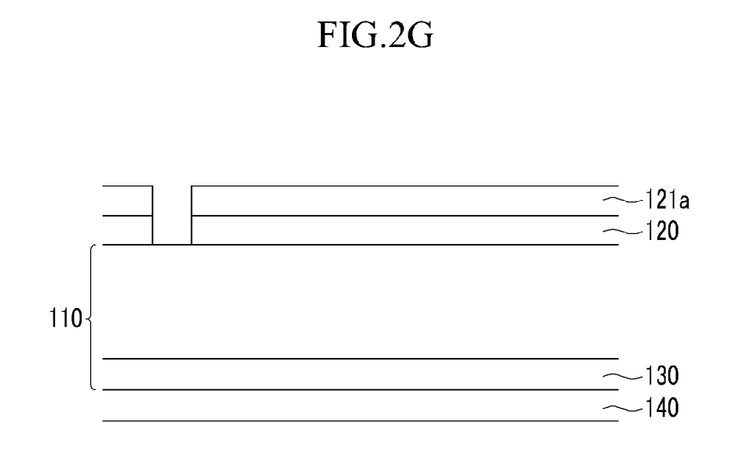
Figure 2H:
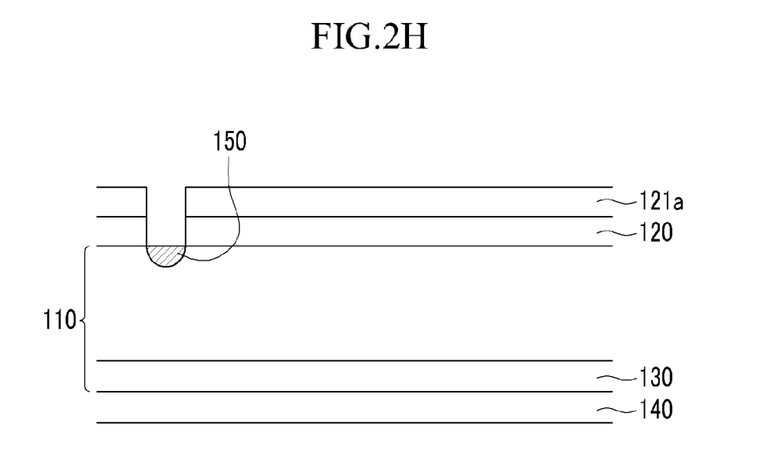
Figure 2I:
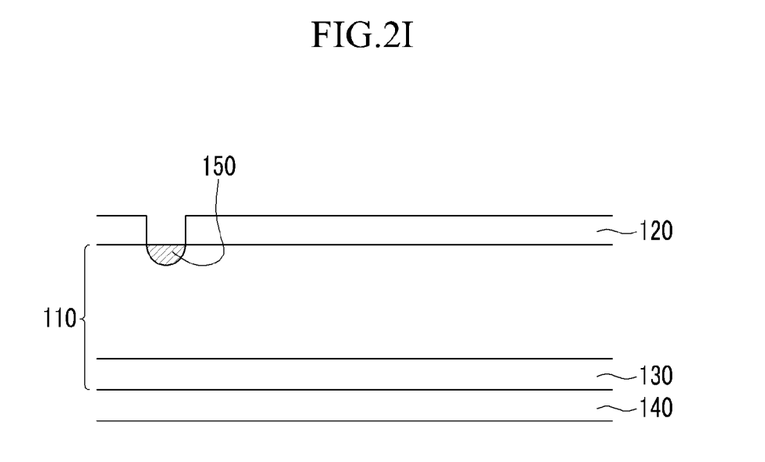
Figure 2J:
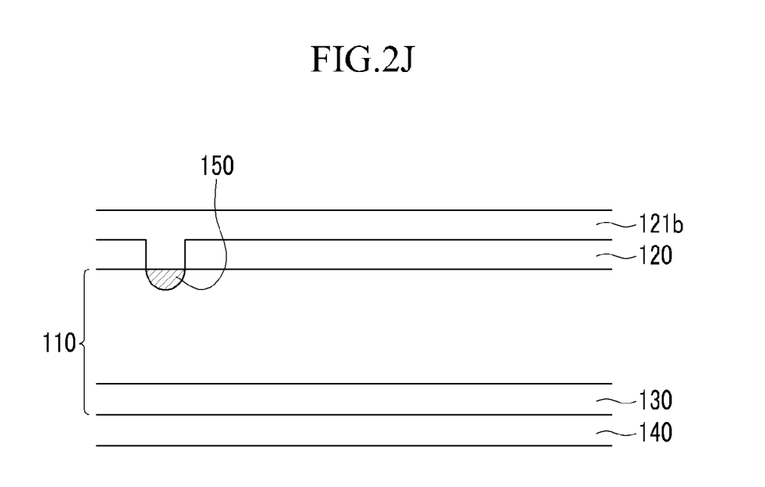
Figure 2K:
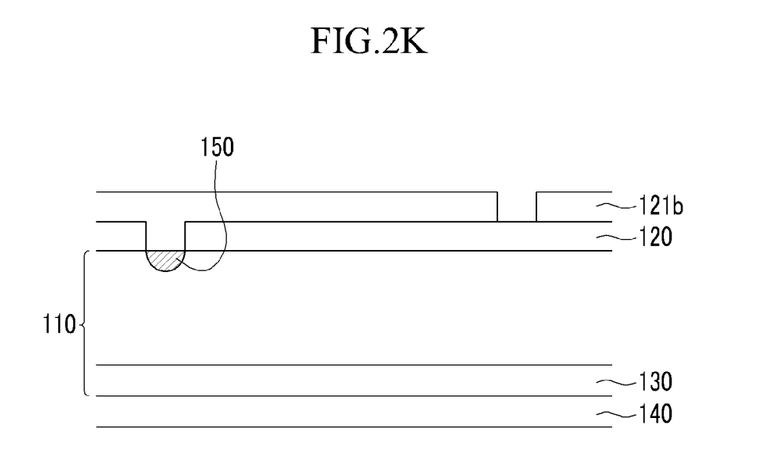
Figure 2L:
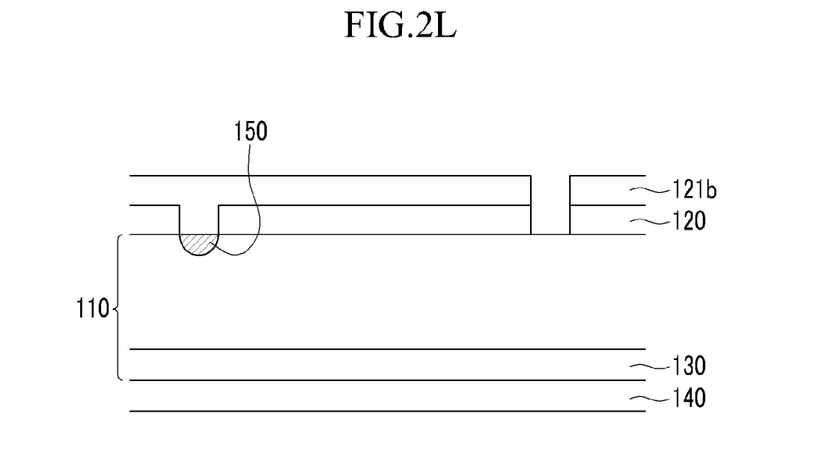
Figure 2M:
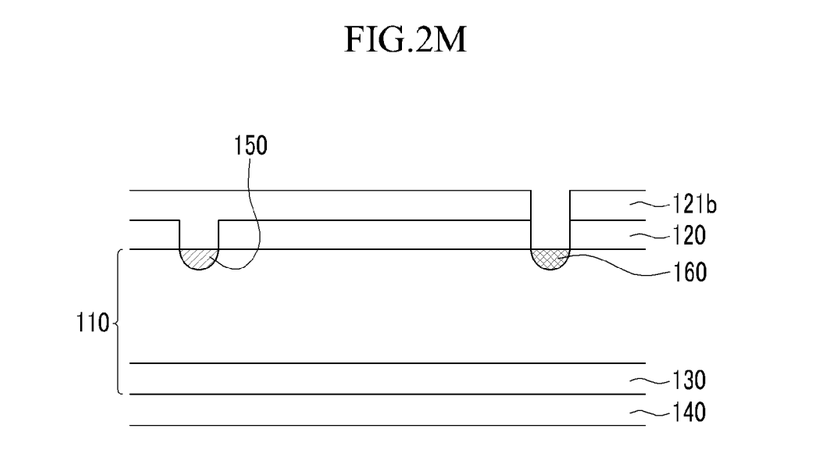
Figure 2N:
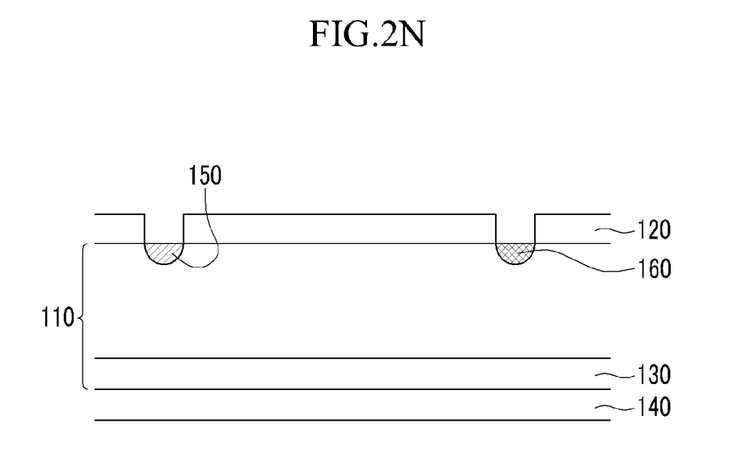
Figure 2O:
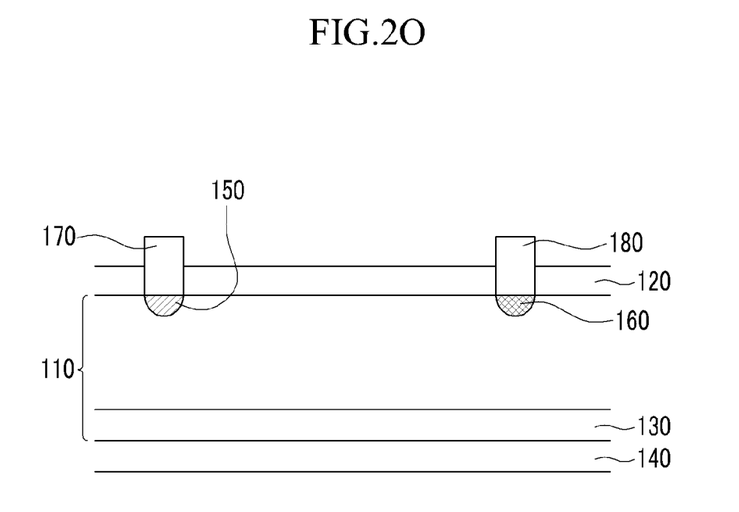

FIG. 1 is a cross-sectional view of an embodiment of a solar cell 100 manufactured according to an embodiment of a manufacturing method to be discussed in more detail with respect to FIGS. 2A to 2O.

Hereinafter, for better understanding and ease of description, a "front side" indicates the side that receives the solar energy in a semiconductor substrate 110, and a "rear side" indicates the other opposite facing side to the front side of the semiconductor substrate 110. In addition, the upper and lower positional relationship is described with respect to the center of the semiconductor substrate 110, but it will be noted that the use of these terms should not be interpreted as limiting the embodiments.

Referring to FIG. 1, the embodiment of a solar cell 100 includes: a semiconductor substrate 110; a reflection layer 130 disposed on a rear side of the semiconductor substrate 110; an n+ region 150 and a p+ region 160 disposed on a front side of the semiconductor substrate 110 and separated from each other; a first electrode 170 electrically connected to the n+ region 150; and a second electrode 180 electrically connected to the p+ region 160.

The semiconductor substrate 110 may include crystalline silicon or compound semiconductors. The crystalline silicon may be a silicon wafer, for example. The semiconductor substrate 110 may be a semiconductor substrate doped with a p-type impurity without limitation. The semiconductor substrate 110 may be a semiconductor substrate doped with an n-type impurity without limitation. The p-type impurity may be a Group III element such as boron (B), aluminum (Al) and the n-type impurity may be a Group V element such as phosphorus (P), arsenic (As), for example, although alternative embodiments include configurations including different materials.

A surface of the semiconductor substrate 110 may be textured. The surface-textured semiconductor substrate 110 may have, for example, protrusions and depressions like a pyramid, or pores like a honeycomb or various other similar configurations. The surface-textured semiconductor substrate 110 may have an enlarged surface area to enhance a light-absorption rate thereof and decrease reflection of light therefrom, resultantly improving efficiency of a solar cell including the same.

The semiconductor substrate 110 may have a thickness of about 50 micro meters (μm) to about 900 μm without limitation. When the semiconductor substrate 110 has a thickness within the abovementioned range, a solar cell module can be more easily manufactured, reducing processing time and costs.

The semiconductor substrate 110 includes the n+ region 150 and the p+ regions 160 separated each other and disposed on the one side, e.g., a same side, of the semiconductor substrate 110.

The n+ region 150 is doped with an n-type impurity, thereby easily collecting produced electrons into an electrode. In addition, the p+ region 160 is doped with a p-type impurity, thereby easily collecting produced holes into an electrode.

The first electrode 170 is disposed on the n+ region 150. The first electrode 170 functions to collect electrons produced from the semiconductor substrate 110 and transports them to the outside, and can include a barrier metal such as silver (Ag), aluminum (Al), copper (Cu), tungsten (W), titanium (Ti), titanium-tungsten (TiW), cobalt (Co), other materials with similar characteristics, or any combinations thereof, for example, but is not limited thereto.

The second electrode 180 is disposed on the p+ region 160. The second electrode 180 functions to collect holes, and can include a barrier metal such as silver (Ag), aluminum (Al), copper (Cu), tungsten (W), titanium (Ti), titanium-tungsten (TiW), cobalt (Co), other materials with similar characteristics, or any combinations thereof, for example, but is not limited thereto.

Although FIG. 1 shows that an anti-reflection layer 120 is disposed on the other part of the front surface of semiconductor substrate 110 where the first electrode 170 and the second electrode 180 are disposed, it is not limited thereto, and alternative embodiments include configurations wherein the anti-reflection layer 120 may be omitted. Specifically, in the present embodiment the anit-reflection layer 120 is disposed on the same surface of the semiconductor substrate 110 as the first electrode 170 and the second electrode 180 and is formed to cover the portions of the semiconductor substrate 110 which are not covered by the n+ region 150, the p+ region 160, the first electrode 170 and the second electrode 180. The anti-reflection layer 120 may include an insulating material that rarely reflects light. The anti-reflection layer 120 may include: an oxide such as aluminum oxide ($Al_2O_3$), silicon oxide ($SiO_2$), titanium oxide ($TiO_2$ or $TiO_4$), magnesium oxide (MgO), cerium oxide (CeO$_2$), other materials with similar characteristics, or any combinations thereof; a nitride such as aluminum nitride (AlN), silicon nitride (SiN$_x$), titanium nitride (TiN), other materials with similar characteristics, or any combinations thereof; or an oxynitride such as aluminum oxynitride (AlON), silicon oxynitride (SiON), titanium oxynitride (TiON), other materials with similar characteristics, or any combinations thereof. The anti-reflection layer 120 may be disposed as a single layer or a multiple layer.

In one embodiment, the anti-reflection layer 120 may have a thickness of about 5 nm to about 300 nm, for example. In another embodiment, the anti-reflection layer may more specifically have a thickness of about 50 nm to about 80 nm.

The anti-reflection layer 120 is disposed on a surface of a front side of the semiconductor substrate 110 for receiving photonic energy, e.g., solar energy, so the anti-reflection layer 120 may decrease light reflectance and increase selectivity of wavelength regions. In addition, the anti-reflection layer 120 may improve contact characteristics with silicon present in the surface of the front side of the semiconductor substrate 110.

The reflection layer 130 may be disposed on the rear side of semiconductor substrate 110. Since the reflection layer 130 extends a light passage distance within the semiconductor substrate 110 by reflecting long-wavelength light into the semiconductor substrate 110, it may enhance a long-wavelength light absorption rate in the semiconductor substrate 110 to improve efficiency of a solar cell utilizing the same. The reflection layer 130 may include SiN$_x$ (wherein x is 0.8≦x<1.8), SiO$_y$ (wherein y is 1.2<y<2.8), SiO$_z$N$_w$ (wherein z is 1.2<z<2.8 and w is 0.8<w<1.8), or any combinations thereof, for example, but is not limited thereto.

Since the reflection layer 130 is disposed by an implantation process and a heating process, voids may be generated within the reflection layer 130, at the surface of the semiconductor substrate 110, or both of the inside and the surface thereof. The reflection layer 130 effectively reflects, e.g., scatters, the long-wavelength light into the semiconductor substrate 110 by including voids and extends a light passage distance of long-wavelength light within the semiconductor substrate 110. Thereby, it is possible to effectively improve the absorption rate of long-wavelength light in the semiconductor substrate 110.

The reflection layer 130 may have a thickness of about 100 nm to about 2000 nm. When the reflection layer 130 has a thickness within the abovementioned range, it is possible to more effectively reflect the long-wavelength light into the semiconductor substrate side again, so the absorption rate of long-wavelength light is more effectively enhanced in the semiconductor substrate.

A passivation layer 140 may be further disposed on the reflection layer 130. Although FIG. 1 shows inclusion of the passivation layer 140, it is not limited thereto, and alternative embodiments include configurations wherein the passivation layer 140 may be omitted. The passivation layer 140 may prevent recombination of charges, e.g., charge carriers such as electrons and holes, and simultaneously reduce leakage current to enhance efficiency of a solar cell. In addition, the passivation layer 140 may passivate the rear side of the semiconductor substrate 110.

The passivation layer 140 may include a material selected from the group including an oxide, a nitride, an oxynitride, other materials with similar characteristics, and any combinations thereof. The oxide includes aluminum oxide (Al$_2$O$_3$), silicon oxide (SiO$_2$), titanium oxide (TiO$_2$ or TiO$_4$), other materials with similar characteristics, or any combination thereof, for example; the nitride includes aluminum nitride (AlN), silicon nitride (SiN$_x$), titanium nitride (TiN), other materials with similar characteristics, or any combination thereof; and the oxynitride includes aluminum oxynitride (AlON), silicon oxynitride (SiON), titanium oxynitride (TiON), other materials with similar characteristics, or any combinations thereof.

The passivation layer 140 may be disposed as a single layer or a multiple layer, and may have a thickness ranging from about 10 nm to about 500 nm. When the passivation layer 140 has a thickness within the abovementioned range, it is possible to more effectively passivate the surface of the rear side of the semiconductor substrate 110, to reflect long-wavelength light into the semiconductor substrate 110 again, to induce enhancement of photoelectric current, and to achieve excellent chemical resistance. In one embodiment, the passivation layer 140 may have a thickness of about 100 nm to about 200 nm, for example.

Hereinafter, an embodiment of a method of manufacturing a solar cell will be shown referring to FIGS. 2A to 2O along with FIG. 1.

FIGS. 2A to 2O are cross-sectional views showing a method of manufacturing a solar cell according to one embodiment.

Referring to FIG. 2A, a semiconductor substrate 110 is provided. The semiconductor substrate 110 may include a silicon wafer, for example. The semiconductor substrate 110 may be doped with a p-type impurity or an n-type impurity.

Still Referring to FIG. 2A, the semiconductor substrate 110 may be textured. The surface texturing may be performed by a wet process using a strong acid solution such as nitric acid and hydrofluoric acid or a strong base solution such as potassium hydroxide and sodium hydroxide, or by a dry process using plasma, for example, but is not limited thereto.

Referring to FIG. 2B, the anti-reflection layer 120 is disposed on a surface of the front side of the semiconductor substrate 110. Although FIG. 2B shows the process of providing the anti-reflection layer 120, but it is not limited thereto, and the process of providing the anti-reflection layer 120 may be omitted. The anti-reflection layer 120 may be disposed by, plasma enhanced chemical vapor deposition ("PECVD") of silicon nitride, for example, but it is not limited thereto, and the anti-reflection layer 120 may be formed by other materials and methods.

As shown in FIG. 2C, the reflection layer 130 is disposed on the rear side of the semiconductor substrate 110. The reflection layer 130 may be disposed on the opposite side to the front surface of the semiconductor substrate 110 where the first electrode and the second electrode are to be disposed.

The process of disposing the reflection layer 130 may include implanting gas into a surface of the rear side of the semiconductor substrate 110 and heating the gas.

As mentioned above, when the reflection layer 130 is obtained by implanting gas into the surface of the rear side of the semiconductor substrate 110 and heating the gas, an additional process of disposing the reflection layer 130 onto the semiconductor substrate 110 is not required. Thereby, the process of manufacturing a solar cell may be simplified and costs of manufacturing a solar cell may be reduced. In addition, since voids may be produced by the gas implantation and the heat treatment, it is possible to more effectively reflect the long-wavelength light into the semiconductor substrate 110 again, so the long-wavelength light may be further absorbed in the semiconductor substrate 110, resultantly improving efficiency of the solar cell.

The gas implanted in the surface of the rear side of the semiconductor substrate 110 may include Nitrogen (N$_2$), Oxygen ($O_2$), or a combination thereof, for example, but is not limited thereto. When the semiconductor substrate is implanted with gas and then heated, the gas may react with a semiconductor included in the semiconductor substrate such as silicon, for example, to provide a material capable of reflecting long-wavelength light, such as $SiN_x$ (wherein x is $0.8<x<1.8$), $SiO_y$ (wherein y is $1.2<y<2.8$), $SiO_zN_w$ (wherein z is $1.2<z<2.8$ and w is $0.8<w<1.8$), or a combination thereof, for example, and voids may be produced.

The gas implanted in the surface of the rear side of the semiconductor substrate 110 may be implanted in a dose of gas ranging from about $1\times10^{10}/cm^2$ to about $1\times10^{19}/cm^2$, and in one embodiment, in a dose of about $1\times10^{14}/cm^2$ to about $1\times10^{19}/cm^2$, and using energy of about 10 keV to about 200 keV. When the gas is implanted into the rear surface of the semiconductor substrate 110 under the abovementioned conditions, it is possible to more effectively produce voids in the reflection layer 130, so the long-wavelength light is effectively reflected into the semiconductor substrate 110 again. Thereby, the absorption rate of long-wavelength light is enhanced in the semiconductor substrate 110 to effectively improve the efficiency of the solar cell. The gas implanted into the surface of the rear side of the semiconductor substrate 110 may be implanted in a dose of about $1\times10^{10}/cm^2$ to about $1\times10^{17}/cm^2$, for example. In another embodiment, the surface of the rear side of the semiconductor substrate 110 may be implanted in a dose of about $1\times10^{14}/cm^2$ to about $1\times10^{17}/cm^2$, and using energy of about 20 keV to about 100 keV.

The heat treatment may be performed at a temperature of about 600° C. to about 1500° C. When the heat treatment is performed within the abovementioned temperature range, voids may be more effectively produced in the reflection layer 130 to effectively reflect long-wavelength light into the semiconductor substrate 110 again. Thereby, a long-wavelength light absorption rate in the semiconductor substrate 110 may be enhanced, so as to effectively improve the efficiency of the solar cell. The heat treatment may be performed at a temperature of about 800° C. to about 1200° C., for example.

Referring to FIG. 2D, the passivation layer 140 is disposed on the reflection layer 130. Although FIG. 2D shows the process of providing the passivation layer 140, it is not limited thereto, and the process of providing the passivation layer 140 may be omitted. The passivation layer 140 may be disposed by, for example, plasma enhanced chemical vapor deposition ("PECVD") of silicon nitride. However, it is not limited thereto, and the passivation layer 140 may be disposed with other materials and methods.

Referring to FIGS. 2E to 2I, the n+ region 150 is disposed on one part of the surface of the front side of the semiconductor substrate 110.

In particular, a first photoresist 121a is disposed on the anti-reflection layer 120, photo-radiated using a patterned mask (not shown), and developed using a developing solution to remove the photoresist 121a on an overlapped part with a part where the n+ region is to be disposed. Subsequently, the anti-reflection layer 120 is etched in the overlapped part with the part where the n+ region is to be disposed by the dry etching process, for example, using chlorine ($Cl_2$) gas, or a fluorine-based gas such as sulfer hexaflourine ($SF_6$), tetrafluoromethane ($CF_4$), hexafluoroethane ($C_2F_6$), hexafluoropropylene ($C_3F_6$), octafluorocyclobutane ($C_4F_8$), nitrogen trifluoride ($NF_3$), and other materials with similar characteristics, for example.

The n+ region 140 may then be disposed by doping a Group V element such as phosphorus (P) or arsenic (As), for example, on a region exposed by the etching process in the semiconductor substrate 110. The doping may include a vapor diffusion method, a solid-phase diffusion method, an ion implantation method, and other similar methods, for example, but is not limited thereto. The photoresist 121a is then removed after the doping is completed.

Referring to FIG. 2J to FIG. 2N, the p+ region 160 may be disposed on a surface of the front side of the semiconductor substrate 110 while being separating from the n+ region 150.

A second photoresist 121b may be dispoded on the anti-reflection layer 120 and photo-radiated using a patterned mask (not shown), for example, and developed by a developing solution to remove the photoresist 121b on an overlapped part with a part where the p+ region is to be disposed. Subsequently, the anti-reflection layer 120 is etched in the overlapped part with the part where the p+ region is to be disposed by the dry etching process, for example, using $Cl_2$ gas, or a fluorine-based gas such as $SF_6$, $CF_4$, $C_2F_6$, $C_3F_6$, $C_4F_8$, $NF_3$, or other materials with similar characteristics, for example. A group III element such as boron (B) is doped in the part of the semiconductor substrate 110 exposed by the etching process to form the p+ region 160. The doping may performed by vapor diffusion, solid-phase diffusion, ion implantation, or other similar methods, for example, but is not limited thereto. The photoresist 121b is removed subsequent to the completion of the doping.

Referring to FIG. 2O, the first electrode 170 is disposed to electrically connect to the n+ region 150 of the semiconductor substrate 110, and the second electrode 180 is disposed to electrically connect to the p+ region 160 of the semiconductor substrate 110.

The first electrode 170 and the second electrode 180 may be disposed by sputtering a material for forming an electrode such as metal or other materials with similar characteristics to provide a coating, and by etching the material using a photoresist.

Although FIG. 2O shows the process of providing an electrode by sputtering and etching using a photoresist, it is not limited thereto, and it may include various methods for providing an electrode in the desirable position.

An embodiment of a solar cell includes a first electrode and a second electrode on a surface of the front side of the semiconductor substrate and a reflection layer disposed by implanting and heating processes on a surface of the rear side of the semiconductor substrate, so it is possible to produce a solar cell with excellent absorption efficiency. In addition, the abovedescribed embodiments of a solar cell and a method for manufacturing the same may facilitate a connection between electrodes of the solar cell while assembling a solar cell module. Thereby, one embodiment of the solar cell may be applied to various fields such as a mobile phone, a camera, a camcorder, a watch, an automobile, a power generator, and various other similar devices, for example.

Furthermore, in one embodiment of a method of manufacturing a solar cell, a reflection layer is disposed on one surface of semiconductor substrate by gas implanting and heating processes, so as to simplify the process of manufacturing the solar cell. Thereby, processing time of manufacturing the solar cell may be shortened, and costs of manufacturing a solar cell may be reduced.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:
1. A method of manufacturing a solar cell, the method comprising:

providing a semiconductor substrate;

disposing a reflection layer on one side of the semiconductor substrate, wherein the disposing the reflection layer comprises implanting gas into a surface of the one side of the semiconductor substrate using energy of about 10 keV to about 200 keV and heating the substrate;

disposing an n+region and a p+region separated from each other on an opposite facing side of the semiconductor substrate;

disposing a first electrode connected to the n+region; and disposing a second electrode connected to the p+region.

2. The method of claim 1, wherein the reflection layer is disposed on a surface of the opposite facing side of the semiconductor substrate where the first electrode and the second electrode are disposed.

3. The method of claim 1, wherein the gas implanted into the surface of the one side of the semiconductor substrate is one of $N_2$, $O_2$, and a combination thereof.

4. The method of claim 1, wherein the implanting gas into the surface of the one side of the semiconductor substrate is performed using a dose of gas ranging from about $1\times10^{10}/cm^2$ to about $1\times10^{19}/cm^2$.

5. The method of claim 1, wherein the heating is performed at a temperature of about 600° C. to about 1500° C.

6. The method of claim 1, further comprising providing an anti-reflection layer on the opposite facing side of the semiconductor substrate.

7. The method of claim 1, further comprising providing a passivation layer on one surface of the reflection layer.

8. A method of manufacturing a solar cell, the method comprising:

providing a semiconductor substrate;

disposing a reflection layer with void on one side of the semiconductor substrate, wherein the disposing the reflection layer comprises implanting gas into a surface of the one side of the semiconductor substrate and heating the substrate to form the reflection layer with void;

disposing an n+region and a p+region separated from each other on an opposite facing side of the semiconductor substrate;

disposing a first electrode connected to the n+region; and disposing a second electrode connected to the p+region.

9. The method of claim 8, wherein the reflection layer is disposed on a surface of the opposite facing side of the semiconductor substrate where the first electrode and the second electrode are disposed.

10. The method of claim 8, wherein the gas implanted into the surface of the one side of the semiconductor substrate is one of $N_2$, $O_2$, and a combination thereof.

11. The method of claim 8, wherein the implanting gas into the surface of the one side of the semiconductor substrate is performed using a dose of gas ranging from about $1\times10^{10}/cm^2$ to about $1\times10^{19}/cm^2$.

12. The method of claim 8, wherein the implanting gas into the surface of the one side of the semiconductor substrate is performed using energy of about 10 keV to about 200 keV.

13. The method of claim 8, wherein the heating is performed at a temperature of about 600° C. to about 1500° C.

14. The method of claim 8, further comprising providing an anti-reflection layer on the opposite facing side of the semiconductor substrate.

15. The method of claim 8, further comprising providing a passivation layer on one surface of the reflection layer.

* * * * *